US009667239B2

United States Patent
Nomiyama et al.

(10) Patent No.: US 9,667,239 B2
(45) Date of Patent: May 30, 2017

(54) VOLTAGE REGULATOR HAVING ENHANCING LINEARITY

(71) Applicant: SAMSUNG ELECTRONICS CO., LTD., Suwon-si, Gyeonggi-Do (KR)

(72) Inventors: Takahiro Nomiyama, Seoul (KR); Dong-Jin Keum, Suwon-si (KR); Hoang Quoc Duong, Seoul (KR); Jae-Yeol Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/171,680

(22) Filed: Jun. 2, 2016

(65) Prior Publication Data

US 2017/0085256 A1    Mar. 23, 2017

(30) Foreign Application Priority Data

Sep. 22, 2015    (KR) .................. 10-2015-0133713

(51) Int. Cl.
| | |
|---|---|
| G05F 1/10 | (2006.01) |
| G06F 3/02 | (2006.01) |
| H03K 17/082 | (2006.01) |
| H03K 5/24 | (2006.01) |
| H03K 3/037 | (2006.01) |
| H03K 19/00 | (2006.01) |
| H03K 19/20 | (2006.01) |
| G05F 1/575 | (2006.01) |

(52) U.S. Cl.
CPC ......... *H03K 17/0822* (2013.01); *G05F 1/575* (2013.01); *H03K 3/0377* (2013.01); *H03K 5/24* (2013.01); *H03K 19/0013* (2013.01); *H03K 19/20* (2013.01)

(58) Field of Classification Search
CPC . G05F 3/262; G05F 3/265; G05F 3/30; G05F 3/205; G11C 5/147
USPC .................. 327/530, 538; 323/273, 280, 282
See application file for complete search history.

(56) References Cited

U.S. PATENT DOCUMENTS 7,148,670 B2    12/2006    Inn et al.
7,388,444 B2     6/2008    Liao
(Continued)

FOREIGN PATENT DOCUMENTS

WO    WO2013/098246 A1    2/2013

*Primary Examiner* — Quan Tra
(74) *Attorney, Agent, or Firm* — Volentine & Whitt, PLLC

(57) ABSTRACT

A voltage regulator includes a high duty cycle detector, a feedback controller, a hysteretic comparator, and first and second drivers. The high duty cycle detector generates a high duty cycle signal based on a power supply voltage and a reference voltage. The feedback controller generates first and second feedback voltages based on the reference voltage, the high duty cycle signal and an output voltage of the voltage regulator. The hysteretic comparator compares the reference voltage and the first feedback voltage to generate a control signal. When the first feedback voltage is activated, the first driver drives an output node that provides the output voltage based on the control signal and the high duty cycle signal. When the second feedback voltage is activated, the second driver generates a third voltage proportional to the reference voltage based on the power supply voltage and the second feedback voltage, and drives the output node with the third voltage.

20 Claims, 13 Drawing Sheets

(56) References Cited

U.S. PATENT DOCUMENTS

| | | |
|---|---|---|
| 7,482,793 B2 | 1/2009 | Stoichita |
| 7,804,282 B2 | 9/2010 | Bertele |
| 8,401,500 B1 | 3/2013 | Bauder et al. |
| 8,552,703 B2 | 10/2013 | Liu et al. |
| 8,854,019 B1 | 10/2014 | Levesque et al. |
| 2006/0208714 A1* | 9/2006 | Saeki .................. H02M 3/1584 323/282 |
| 2012/0032661 A1* | 2/2012 | Nakamura ............ H02M 3/156 323/288 |
| 2014/0132232 A1 | 5/2014 | Maclean et al. |
| 2014/0375288 A1 | 12/2014 | Nora |
| 2016/0254746 A1* | 9/2016 | Lerdworatawee .... H02M 3/158 323/271 |

* cited by examiner

VOLTAGE REGULATOR HAVING ENHANCING LINEARITY

CROSS-REFERENCE TO RELATED APPLICATION

A claim of priority under 35 USC §119 is made to Korean Patent Application No. 10-2015-0133713, filed on Sep. 22, 2015, in the Korean Intellectual Property Office (KIPO), the entire contents of which are hereby incorporated by reference.

BACKGROUND

The present inventive concept herein relates generally to semiconductor integrated circuits, and more particularly to a voltage regulator having enhanced linearity in an operation region of high duty cycle.

Switching regulators are commonly used to provide power to devices such as RF power amplifiers which have a variable input voltage depending on output power. Typically, the input voltage of an RF power amplifier should be changed rapidly to reduce total power dissipation. In general, if the power consumption of a switching regulator is increased, its voltage transient response becomes fast, which is however unsuitable for mobile devices which are powered by limited power sources. Hysteretic regulators on the other hand are useful for operation with mobile devices because hysteretic regulators may realize low power consumption and fast voltage transient response in comparison with voltage-mode or current-mode switching regulators. However, a problem with hysteretic regulators is that a large output voltage ripple is produced in an operation region of high duty cycle, that is an operation region where a difference between an input voltage and an output voltage of the hysteretic regulator is small.

SUMMARY

Embodiments of the inventive concept provide a voltage regulator having high linearity between a reference voltage and an output voltage in an operation region of high duty cycle.

Embodiment of the inventive concept may provide a voltage regulator capable of preventing a reverse current and/or an over current.

Embodiments of the inventive concept provide a voltage regulator including a high duty cycle detector, a feedback controller, a hysteretic comparator, a first driver, a low pass filter and a second driver. The high duty cycle detector is configured to generate a high duty cycle signal based on a power supply voltage and a reference voltage. The feedback controller is configured to generate a first feedback voltage and a second feedback voltage based on the reference voltage, the high duty cycle signal, an output voltage of the voltage regulator and a first voltage. The hysteretic comparator is configured to compare the reference voltage and the first feedback voltage to generate a control signal. When the first feedback voltage is activated, the first driver is configured to drive a node that provides the first voltage with the power supply voltage or a ground voltage based on the control signal and the high duty cycle signal. The low pass filter is configured to filter the first voltage to generate a second voltage and is configured to drive an output node that provides the output voltage with the second voltage. When the second feedback voltage is activated, the second driver is configured to generate a third voltage proportional to the reference voltage based on the power supply voltage and the second feedback voltage and is configured to drive the output node with the third voltage.

The high duty cycle signal provides indication of a duty cycle of the control signal, and a slope of the output voltage with respect to the reference voltage when the first feedback voltage is activated may be equal to a slope of the output voltage with respect to the reference voltage when the second feedback voltage is activated.

The first feedback voltage may be activated when the first feedback voltage is equal to or lower than a sum of the reference voltage and a hysteretic voltage of the hysteretic comparator, and the first feedback voltage may be deactivated when the first feedback voltage is higher than the sum of the reference voltage and the hysteretic voltage. The second feedback voltage may be activated when the second feedback voltage is lower than the power supply voltage, and the second feedback voltage may be deactivated when the second feedback voltage is equal to the power supply voltage.

When the high duty cycle signal is activated, the feedback controller is configured to activate the second feedback voltage and the second driver is configured to drive the output node with the third voltage. When the high duty cycle signal is deactivated, the feedback controller is configured to activate the first feedback voltage and the low pass filter is configured to drive the output node with the second voltage.

The high duty cycle detector may include a first resistor connected between the power supply voltage and a first node, a second resistor connected between the first node and the ground voltage, and a comparator having a positive input terminal connected to the reference voltage, a negative input terminal connected to the first node and an output terminal. The comparator is configured to provide the high duty cycle signal at the output terminal.

The hysteretic comparator may have a positive input terminal connected to the reference voltage, a negative input voltage connected to the first feedback voltage and an output terminal. The hysteretic comparator is configured to provide the control signal at the output terminal. The hysteretic comparator is configured to activate the control signal when a voltage difference between the reference voltage and the first feedback voltage transitions from a negative value to a positive value, and deactivate the control signal when the voltage difference becomes lower than a hysteretic voltage of the hysteretic comparator.

The first driver is configured to drive the node that provides the first voltage with the power supply voltage when the control signal is activated, and drive the node that provides the first voltage with the ground voltage when the control signal is deactivated and the high duty cycle signal is deactivated. The first driver is configured to be disabled when the control signal is deactivated and the high duty cycle signal is activated.

The first driver may include a first inverter having an input terminal connected to the control signal and an output terminal connected to a first node, a second inverter having an input terminal connected to the high duty cycle signal, an AND logic gate having a first input terminal connected to an output terminal of the second inverter and a second input terminal connected to the first node, a P-channel metal oxide semiconductor (PMOS) transistor having a source electrode connected to the power supply voltage, a drain electrode connected to a second node and a gate electrode connected to the first node, wherein the second node is the node that provides the first voltage, and an N-channel metal oxide semiconductor (NMOS) transistor having a source electrode connected to the ground voltage, a drain electrode connected to the second node and a gate electrode connected to an output terminal of the AND logic gate.

The feedback controller may include a first resistor connected between the power supply voltage and a first node, a second resistor connected between the first node and the ground voltage, a first switch configured to selectively connect the first node and a third node in response to the high duty cycle signal, a second switch configured to selectively connect a second node and the third node in response to the high duty cycle signal, wherein the second node is connected to the reference voltage, a third switch configured to selectively connect the second node and a fourth node in response to the high duty cycle signal, a fourth switch configured to selectively connect the first node and the fourth node in response to the high duty cycle signal, a first amplifier having a positive input terminal connected to the third node, a negative input terminal connected to the fourth node, and an output terminal connected to a fifth node, a fifth switch configured to selectively connect the fifth node and a sixth node in response to the high duty cycle signal to provide the first feedback voltage from the sixth node when the fifth and sixth nodes are connected, a sixth switch configured to selectively connect the fifth node and a seventh node in response to the high duty cycle signal, a third resistor connected between the output voltage and the sixth node, a fourth resistor connected between the sixth node and the ground voltage, a ripple injection circuit configured to generate a ripple voltage and to apply the ripple voltage to the sixth node, a fifth resistor connected between the output voltage and the seventh node, a sixth resistor connected between the seventh node and the ground voltage and a second amplifier having a positive input terminal connected to the seventh node, a negative input terminal connected to the reference voltage and an output terminal, the second amplifier configured to provide the second feedback voltage at the output terminal of the second amplifier.

The low pass filter may include an inductor connected between the first voltage and a first internal node, and a capacitor connected between the first internal node and the ground voltage. The low pass filter is configured to provide the second voltage at the first internal node. The second driver may include a driving transistor having a source electrode connected to the power supply voltage, a gate electrode connected to the second feedback voltage and a drain electrode, the driving transistor configured to provide the third voltage at the drain electrode.

Example embodiments of the inventive concept provide a voltage regulator includes a high duty cycle detector configured to generate a high duty cycle signal based on a power supply voltage and a reference voltage, a feedback controller configured to generate a first feedback voltage and a second feedback voltage based on the reference voltage, the high duty cycle signal, an output voltage of the voltage regulator and a first voltage, a hysteretic comparator configured to compare the reference voltage and the first feedback voltage to generate a control signal, a current sensor configured to generate a reverse current control signal and an over current control signal based on the second feedback voltage, a first driver configured to drive a node that provides the first voltage with the power supply voltage or a ground voltage based on the control signal and the reverse current control signal, when the first feedback voltage is activated, a low pass filter configured to filter the first voltage to generate a second voltage and configured to drive an output node that provides the output voltage with the second voltage, and a second driver configured to generate a third voltage proportional to the reference voltage based on the power supply voltage, the second feedback voltage and the over current control signal and configured to drive the output node with the third voltage, when the second feedback voltage is activated.

The first driver is configured to be disabled when the reverse current control signal is activated, and the second driver is configured to be disabled when the over current control signal is activated.

The current sensor may include a P-channel metal oxide semiconductor (PMOS) transistor having a source electrode connected to the power supply voltage, a drain electrode connected to a first node and a gate electrode connected to the second feedback voltage, a first N-channel metal oxide semiconductor (NMOS) transistor having a source electrode connected to the ground voltage, a drain electrode connected to the first node and a gate electrode connected to the first node, a second NMOS transistor having a source electrode connected to the ground voltage, a drain electrode connected to a second node and a gate electrode connected to the first node, a sensing resistor connected between the power supply voltage and the second node, a first amplifier having a positive input terminal connected to an over current reference voltage, a negative input voltage connected to the second node, and an output terminal, the first amplifier configured to provide the over current control signal at the output terminal of the first amplifier, and a second amplifier having a positive input terminal connected to a reverse current reference voltage, a negative input voltage connected to the second node and an output terminal, the second amplifier configured to provide the reverse current control signal at the output terminal of the second amplifier.

The first driver may include a first inverter having an input terminal connected to the control signal and an output terminal connected to a first node, a second inverter having an input terminal connected to the reverse current control signal, an AND logic gate having a first input terminal connected to an output terminal of the second inverter and a second input terminal connected to the first node, a PMOS transistor having a source electrode connected to the power supply voltage, a drain electrode connected to a second node and a gate electrode connected to the first node, wherein the second node is the node that provides the first voltage, and an NMOS transistor having a source electrode connected to the ground voltage, a drain electrode connected to the second node and a gate electrode connected to an output terminal of the AND logic gate.

The second driver may include a driving transistor having a source electrode connected to the power supply voltage, a gate electrode, and a drain electrode, the driving transistor configured to provide the third voltage at the drain of the driving transistor, a first switching transistor having a source electrode connected to the second feedback voltage, a gate electrode connected to the over current control signal and a drain electrode connected to the gate electrode of the driving transistor, and a second switching transistor having a source electrode connected to the power supply voltage, a gate electrode connected to an inverted version of the over current control signal and a drain electrode connected to the gate electrode of the driving transistor.

Example embodiments of the inventive concept provide a mobile system including at least one processor configured to execute applications stored in a memory device; a connectivity unit configured to perform wireless communications with an external device; and a power supply unit configured to supply an operating voltage to the mobile system. The power supply unit comprising a voltage regulator configured to output the operating voltage. The voltage regulator includes a high duty cycle detector configured to generate a high duty cycle signal based on a power supply voltage and a reference voltage; a feedback controller configured to generate a first feedback voltage and a second feedback voltage based on the reference voltage, the high duty cycle signal, the operating voltage and a first voltage; a hysteretic comparator configured to compare the reference voltage and the first feedback voltage to generate a control signal; a first driver configured to drive a node that provides the first voltage with the power supply voltage or a ground voltage based on the control signal, when the first feedback voltage is activated; a low pass filter configured to filter the first voltage to generate a second voltage and configured to drive an output node that provides the operating voltage with the second voltage; and a second driver configured to generate a third voltage proportional to the reference voltage based on the power supply voltage and the second feedback voltage and configured to drive the output node with the third voltage, when the second feedback voltage is activated.

The voltage regulator according to example embodiments may maintain high linearity between the reference voltage and the output voltage in the operation region of high duty cycle of the control signal, and thus the output voltage may be varied with fast voltage transient response and without ripple even when the output voltage is varied near the input voltage. Also the voltage regulator according to example embodiments may reduce power consumption by preventing reverse current and/or over current during voltage regulation.

BRIEF DESCRIPTION OF THE DRAWINGS

Example embodiments of the present inventive disclosure will be more clearly understood from the following detailed description taken in conjunction with the accompanying drawings.

DETAILED DESCRIPTION OF THE EMBODIMENTS

Figure 1:
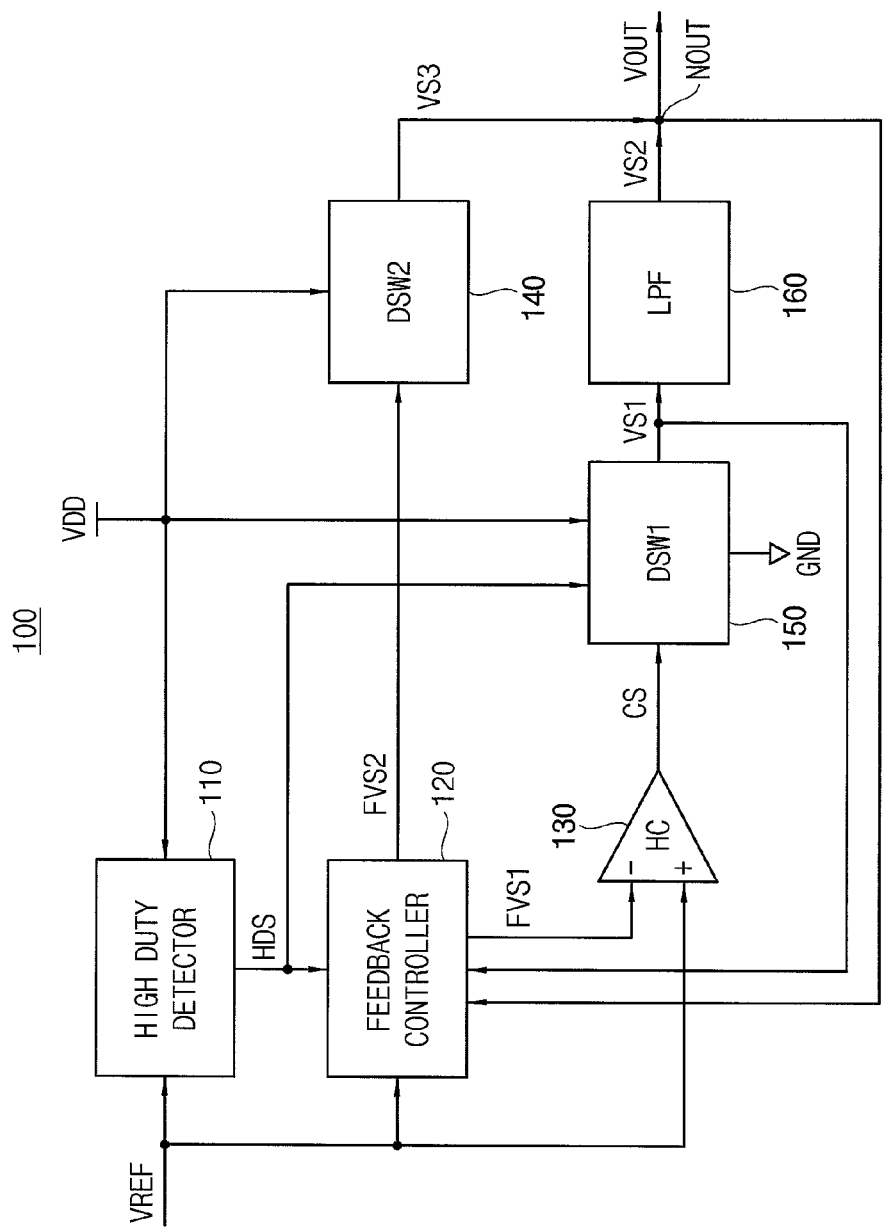
FIG. 1 illustrates a block diagram of a voltage regulator according to an example embodiment of the inventive concept.

Various example embodiments of the inventive concept will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It should be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It should be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As is traditional in the field of the inventive concept, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concept. Likewise, the blocks of the embodiments may be physically combined into more complex blocks without departing from the scope of the inventive concept.

FIG. 1 illustrates a block diagram of voltage regulator 100 according to an example embodiment of the inventive concept.

Referring to FIG. 1, voltage regulator 100 includes a high duty cycle detector 110, a feedback controller 120, a hysteretic comparator HC 130, a first driver DSW1 150, a low pass filter LPF 160 and a second driver DSW2 140.

The high duty cycle detector 110 generates a high duty cycle signal HDS based on a power supply voltage VDD and a reference voltage VREF. The high duty cycle signal HDS may represent whether a duty cycle of a control signal CS output from the hysteretic comparator 130 is higher than a reference value. As a level of an output voltage VOUT of the voltage regulator 100 approaches a level of the power supply voltage VDD, the duty cycle of the control signal CS increases and a ripple in the output voltage VOUT increases. For example, the reference voltage VREF may be set to half the output voltage VOUT. The high duty cycle detector 110 compares the reference voltage VREF with a threshold voltage that is generated by dividing the power supply voltage VDD, and based on the comparison detects whether the duty cycle of the control signal CS exceeds the reference value, and the detection result is output as the high duty cycle signal HDS. The high duty cycle detector 110 will be further described below with reference to FIG. 2. The relation between the duty cycle of the control signal CS and a difference between the output voltage VOUT and the power supply voltage VDD will be described with reference to FIGS. 6 and 7.

The feedback controller 120 generates a first feedback voltage FVS1 and a second feedback voltage FVS2 based on the reference voltage VREF, the high duty cycle signal HDS, the output voltage VOUT and a first voltage VS1. The feedback controller 120 may activate at least one of the first feedback voltage FVS1 and the second feedback voltage FVS2 based on the reference voltage VREF, the high duty cycle signal HDS, the output voltage VOUT and the first voltage VS1. For example, the feedback controller 120 deactivates the first feedback voltage FVS1 and activates the second feedback voltage FVS2 when the high duty cycle signal HDS is activated. Also the feedback controller 120 activates the first feedback voltage FVS1 and deactivates the second feedback voltage FVS2 when the high duty cycle signal HDS is deactivated. The feedback controller will be further described with reference to FIGS. 5, 6 and 7.

It may be regarded that the first feedback voltage FVS1 is activated when the first feedback voltage FVS1 is equal to or lower than a sum of the reference voltage VREF and a hysteretic voltage of the hysteretic comparator 130, and the first feedback voltage FVS1 is deactivated when the first feedback voltage FVS1 is higher than the sum of the reference voltage VREF and the hysteretic voltage. Also, it may be regarded that the second feedback voltage FVS2 is activated when the second feedback voltage FVS2 is lower than the power supply voltage VDD, and the second feedback voltage FVS2 is deactivated when the second feedback voltage FVS2 is equal to the power supply voltage VDD.

The hysteretic comparator 130 compares the reference voltage VREF and the first feedback voltage FVS1 to generate the control signal CS. The hysteretic comparator has a positive input terminal connected to the reference voltage VREF, a negative input terminal connected to the first feedback voltage FVS1 and an output terminal that outputs the control signal CS. The configuration of the hysteretic comparator 130 may be varied as well known to those skilled in the art. An operation of the hysteretic comparator 130 will be described below with reference to FIG. 3.

When the first feedback voltage FVS1 is activated, the first driver 150 drives a node that provides the first voltage VS1 with the power supply voltage VDD or a ground voltage GND based on the control signal CS and the high duty cycle signal HDS. The first driver 150 will be further described below with reference to FIG. 4.

The low pass filter 160 filters the first voltage VS1 to generate a second voltage VS2, and drives an output node NOUT that provides the output voltage VOUT with the second voltage VS2. The low pass filter 160 will be further described below with reference to FIG. 8.

When the second feedback voltage FVS2 is activated, the second driver 140 generates a third voltage VS3 proportional to the reference voltage VREF based on the power supply voltage VDD and the second feedback voltage FVS2, and drives the output node NOUT with the third voltage VS3. The second driver 140 will be further described below with reference to FIG. 9.

When the high duty cycle signal HDS is activated, the feedback controller 120 activates the second feedback voltage FVS2, and the second driver 140 drives the output node NOUT with the third voltage VS3 to provide the output voltage VOUT. When the high duty cycle signal HDS is deactivated, the feedback controller 120 activates the first feedback voltage FVS1 and the low pass filter 160 drives the output node NOUT with the second voltage VS2 to provide the output voltage VOUT.

Figure 2:
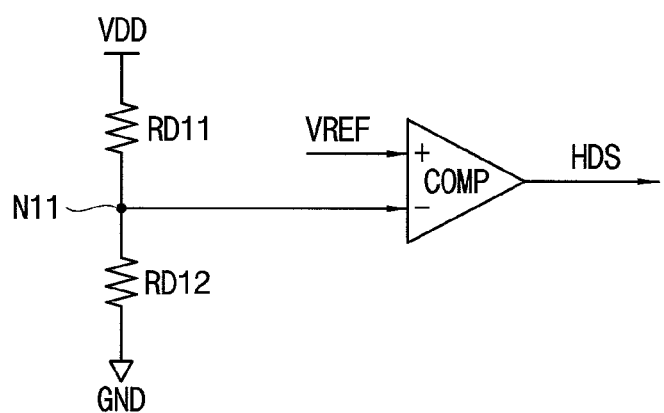
FIG. 2 illustrates a circuit diagram of a high duty cycle detector included in the voltage regulator of FIG. 1 according to an example embodiment of the inventive concept.

FIG. 2 illustrates a circuit diagram of high duty cycle detector 110 included in the voltage regulator of FIG. 1 according to an example embodiment of the inventive concept.

Referring to FIG. 2, high duty cycle detector 110 includes a first resistor RD11, a second resistor RD12 and a comparator COMP.

The first resistor RD11 is connected between the power supply voltage VDD and a first node N11. The second resistor RD12 is connected between the first node N11 and the ground voltage GND. The comparator has a positive input terminal connected to the reference voltage VREF, a negative input terminal connected to the first node N11 and an output terminal outputting the high duty cycle signal HDS.

As described previously, the high duty cycle signal HDS provides indication of whether the duty cycle of the control signal CS is higher than a reference value. The reference value may be determined based on a ratio of the output voltage VOUT and the reference voltage VREF, and a ratio of resistances of the first resistor RD11 and the second resistor RD12.

In an example embodiment, the ratio of the reference voltage VREF to the output voltage VOUT may be 1/2, and the ratio of the resistance of the first resistor RD11 to the resistance of the second resistor RD12 may be 11/9 for example. In this case, the high duty cycle signal HDS is activated to a logic high level when the output voltage VOUT exceeds 90% of the power supply voltage VDD. In other words, the high duty cycle signal HDS is activated to a logic high level when the duty cycle of the control signal CS is higher than the reference value. If the output voltage VOUT does not exceed 90% of the power supply voltage VDD, the high duty cycle signal HDS is deactivated to a logic low level. In other words, the high duty cycle signal HDS is deactivated to a logic low level when the duty cycle of the control signal CS is equal to or lower than the reference value. The above description may be understood from the fact that the output voltage VOUT is increased as the duty cycle of the control signal CS is increased as described with reference to FIG. 4.

Figure 3:
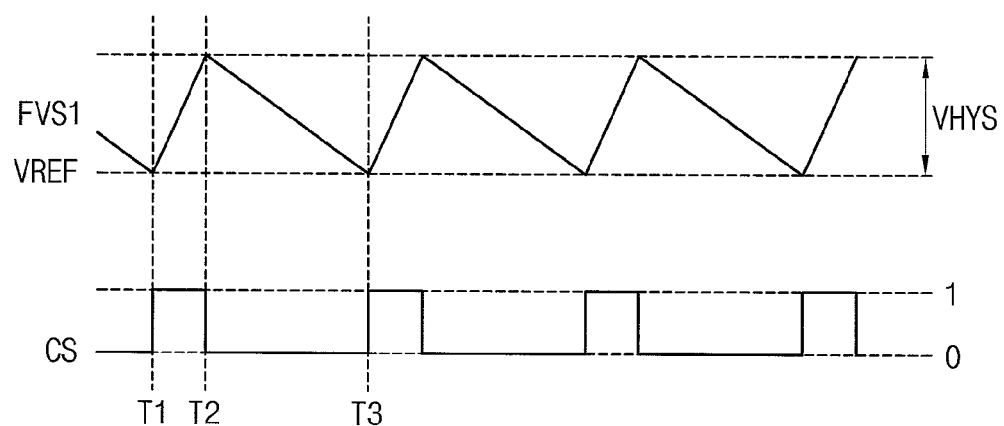
FIG. 3 illustrates a diagram descriptive of the operation of a hysteretic comparator included in the voltage regulator of FIG. 1 according to an example embodiment of the inventive concept.

FIG. 3 illustrates a diagram descriptive of the operation of hysteretic comparator 130 included in the voltage regulator of FIG. 1 according to embodiments of the inventive concept.

Referring to FIG. 3, the hysteretic comparator 130 activates the control signal CS to the logic high level at points such as time points T1 and T3 for example, when a voltage difference between the reference voltage VREF and the first feedback voltage FVS1 is decreased to zero. The hysteretic comparator 130 deactivates the control signal CS to the logic low level at time points such as time point T2 for example, when the voltage difference between the reference voltage VREF and the first feedback voltage FVS1 is increased to a hysteretic voltage VHYS of the hysteretic comparator 130.

Figure 4:
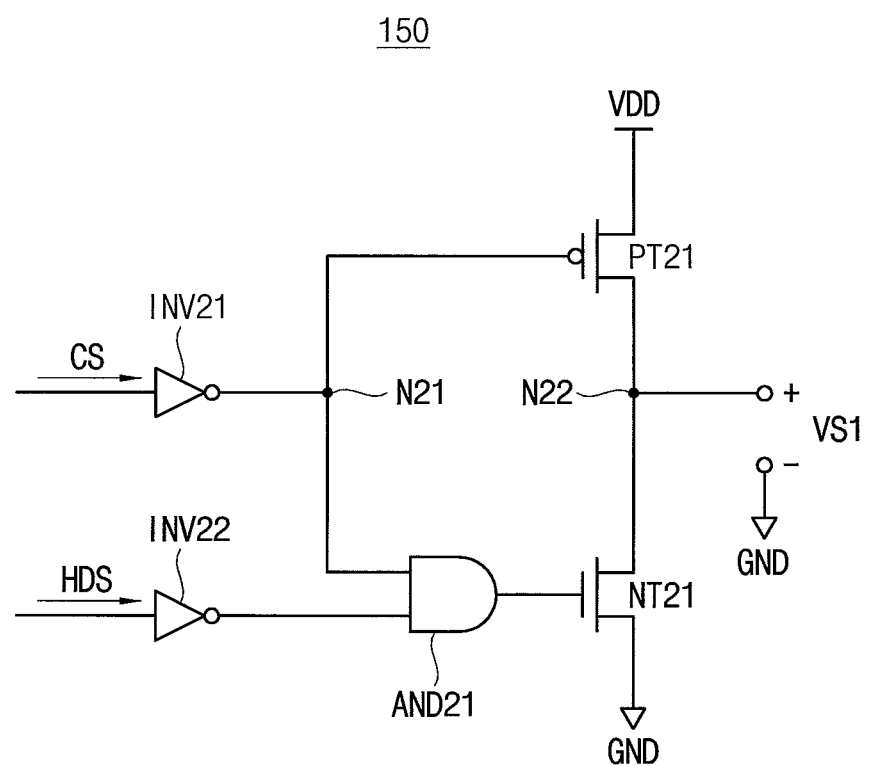
FIG. 4 illustrates a circuit diagram of a first driver included in the voltage regulator of FIG. 1 according to an example embodiment of the inventive concept.

FIG. 4 illustrates a circuit diagram of first driver 150 included in the voltage regulator of FIG. 1 according to an example embodiment of the inventive concept.

Referring to FIG. 4, first driver 150 includes a P-channel metal oxide semiconductor (PMOS) transistor PT21, an N-channel metal oxide semiconductor (NMOS) transistor NT21, a first inverter INV21, a second inverter INV22 and an AND logic gate AND21.

The first inverter INV21 has an input terminal connected to the control signal CS and an output terminal connected to a first node N21. The second inverter INV22 has an input terminal connected to the high duty cycle signal HDS. The AND logic gate AND21 has a first input terminal connected to an output terminal of the second inverter INV22 and a second input terminal connected to the first node N21. The PMOS transistor PT21 has a source electrode connected to the power supply voltage VDD, a drain electrode connected to a second node N22 and a gate electrode connected to the first node N21. The second node N22 corresponds to the node that provides the first voltage VS1. The NMOS transistor NT21 has a source electrode connected to the ground voltage GND, a drain electrode connected to the second node N22 and a gate electrode connected to an output terminal of the AND logic gate AND21.

The PMOS transistor PT21 drives the second node N22 that provides the first voltage VS1 as an output with the power supply voltage VDD when the control signal CS is activated. The NMOS transistor NT21 drives the second node N22 with the ground voltage GND when the control signal CS is deactivated and the high duty cycle signal HDS is deactivated. When the control signal CS is deactivated and the high duty cycle signal HDS is activated, the PMOS transistor PT21 and the NMOS transistor NT21 are turned off and thus the first driver 150 may by disabled. In this case, the NMOS transistor NT21 may operate as a reverse-directional diode, and the NMOS transistor NT21 together with the low pass filter 160 in FIG. 1 may operate as a typical switching buck converter.

Figure 5:
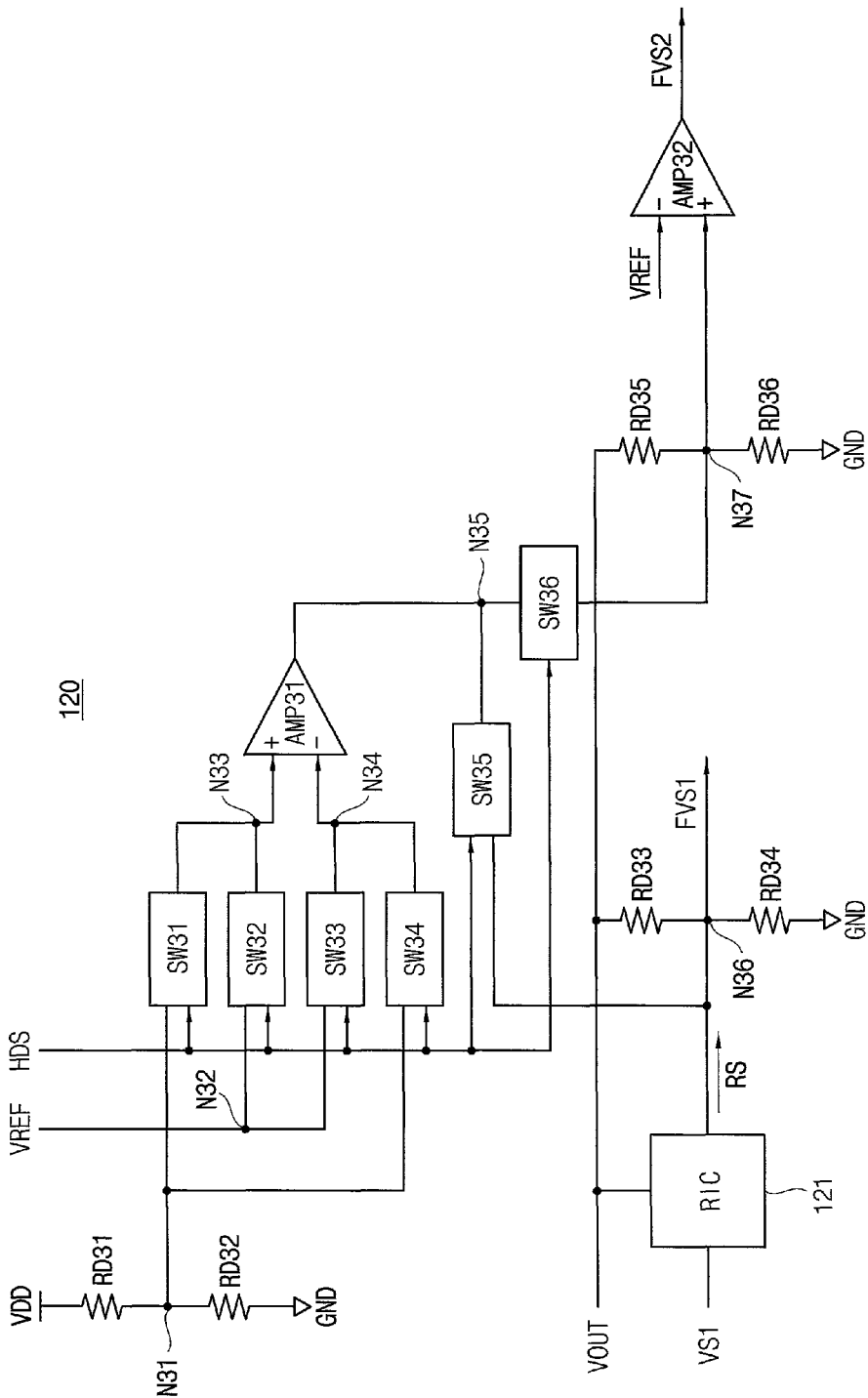
FIG. 5 illustrates a circuit diagram of a feedback controller included in the voltage regulator of FIG. 1 according to an example embodiment of the inventive concept.

FIG. 5 illustrates a circuit diagram of feedback controller 120 included in the voltage regulator of FIG. 1 according to an example embodiment of the inventive concept.

Referring to FIG. 5, feedback controller 120 includes first through sixth resistors RD31 through RD36, first through sixth switches SW31 through SW36, first and second amplifiers AMP31 and AMP32 and a ripple injection circuit RIC 121.

The first resistor RD31 is connected between the power supply voltage VDD and a first node N31. The second resistor RD32 is connected between the first node N31 and the ground voltage GND. The first switch SW31 selectively connects the first node N31 and a third node N33 in response to the high duty cycle signal HDS. The second switch SW2 selectively connects a second node N32 connected to the reference voltage VREF and the third node N33 in response to the high duty cycle signal HDS. The third switch SW33 selectively connects the second node N32 and a fourth node N34 in response to the high duty cycle signal HDS. The fourth switch SW34 selectively connects the first node N31 and the fourth node N34 in response to the high duty cycle signal HDS. The first amplifier AMP31 has a positive input terminal connected to the third node N33, a negative input terminal connected to the fourth node N34 and an output terminal connected to a fifth node N35. The fifth switch SW35 selectively connects the fifth node N35 and a sixth node N36 that provides the first feedback voltage FVS1 in response to the high duty cycle signal HDS. The sixth switch SW36 selectively connects the fifth node N35 and a seventh node N37 in response to the high duty cycle signal HDS. The third resistor RD33 is connected between the output voltage VOUT and the sixth node N36. The fourth resistor RD34 is connected between the sixth node N36 and the ground voltage GND. The ripple injection circuit 121 generates a ripple voltage RS and applies the ripple voltage RS to the sixth node N36. The fifth resistor RD35 is connected between the output voltage VOUT and the seventh node N37. The sixth resistor RD36 is connected between the seventh node N37 and the ground voltage GND. The second amplifier AMP32 has a positive input terminal connected to the seventh node N37, a negative input terminal connected to the reference voltage VREF and an output terminal outputting the second feedback voltage FVS2.

For example, the reference voltage VREF may be half the output voltage VOUT, and third through sixth resistors RD33 through RD36 may have the same resistance.

When the high duty cycle signal HDS is deactivated, for example when the reference voltage VREF does not exceed 90% of the power supply voltage VDD, the first switch SW31 connects the first node N31 and the third node N33, the third switch SW33 connects the second node N32 and the fourth node N34, the sixth switch SW36 connects the fifth node N35 and the seventh node N37, the second switch SW32 disconnects the second node N32 and the third node N33, the fourth switch N34 disconnects the first node N31 and the fourth node N34, and the fifth switch SW35 disconnects the fifth node N35 and the sixth node N36. In this case, the first amplifier AMP31 outputs, to the seventh node N37, a positive current corresponding to an amplified value of a difference between 90% of the power supply voltage VDD and the reference voltage VREF. Through the output current from the first amplifier AMP31, the voltage at the seventh node N37 may be increased greater than VOUT/2, the second feedback voltage FVS2 may be increased and deactivated, and thus the second driver 140 in FIG. 1 may be disabled. In contrast, the first driver 150 in FIG. 1 may be enabled to generate the first voltage VS1 and the low pass filter 160 in FIG. 1 may drive the output node NOUT that provides the output voltage VOUT with the second voltage VS2.

When the high duty cycle signal HDS is activated, for example when the reference voltage VREF exceeds 90% of the power supply voltage VDD, the first switch SW31 disconnects the first node N31 and the third node N33, the third switch SW33 disconnects the second node N32 and the fourth node N34, the sixth switch SW36 disconnects the fifth node N35 and the seventh node N37, the second switch SW32 connects the second node N32 and the third node N33, the fourth switch N34 connects the first node N31 and the fourth node N34, and the fifth switch SW35 connects the fifth node N35 and the sixth node N36. In this case, the first amplifier AMP31 outputs to the sixth node N36 a positive current corresponding to an amplified value of a difference between the reference voltage VREF and 90% of the power supply voltage VDD. Through the output current from the first amplifier AMP31, the first feedback voltage FVS1 may be increased and deactivated, and thus the first driver 150 in FIG. 1 may be disabled. In contrast, the second driver 140 in FIG. 1 may be enabled to drive the output node NOUT that provides the output voltage VOUT with the third voltage VS3.

Figure 6:
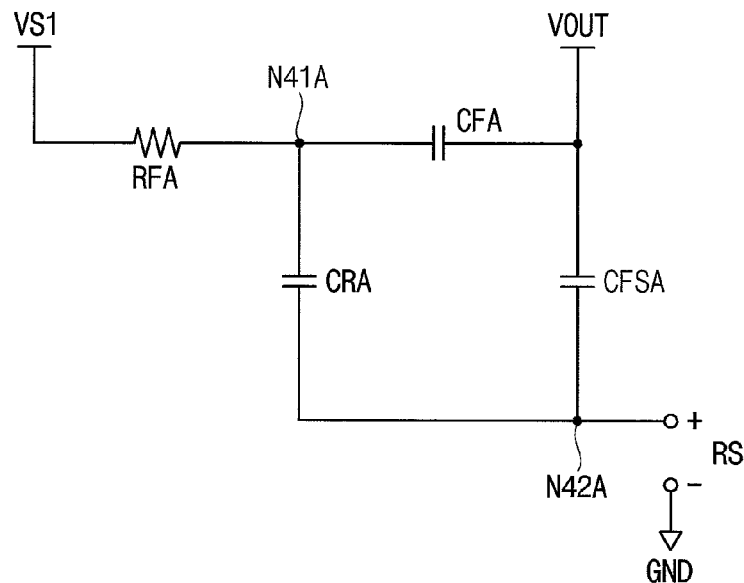
FIGS. 6 and 7 illustrate circuit diagrams of a ripple injection circuit included in the feedback controller of FIG. 5 according to example embodiments of the inventive concept.
Figure 7:
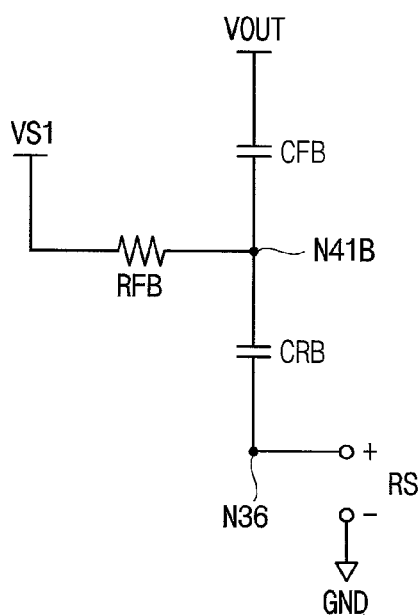

FIGS. 6 and 7 illustrate circuit diagrams of ripple injection circuit 121 included in the feedback controller of FIG. 5 according to example embodiments of the inventive concept.

Referring to FIG. 6, ripple injection circuit 121A includes a feedback resistor RFA and first, second and third capacitors CFA, CRA and CFSA.

The feedback resistor RFA is connected between the first voltage VS1 and a first internal node N41A. The first capacitor CFA is connected between the first internal node N41A and the output voltage VOUT. The second capacitor CRA is connected between the first internal node N41A and a second internal node N42A. The third capacitor CFSA is connected between the output voltage VOUT and the second internal node N42A. The voltage at the second internal node N42A corresponds to the ripple voltage RS.

If the voltage regulator 100 shown in FIG. 1 includes the feedback controller 120 of FIG. 5 implemented with the ripple injection circuit 121A of FIG. 6, the rising slope dVrise of the first feedback voltage FVS1 from the time point T1 to the time point T2 in FIG. 3 for example, the falling slope dVfall of the first feedback voltage FVS1 from the time point T2 to the time point T3 in FIG. 3 for example, and the period T of the control signal CS such as from time point T1 to time point T3 for example, may be represented as Expression1, where VHYS is the hysteretic voltage of the hysteretic comparator 130.

$$dV_{rise} = \frac{V_{DD} - V_{OUT}}{R_{FA} \times C_{FA}} \times \frac{C_{RA}}{C_{FSA} + C_{RA}}$$

$$dV_{fall} = \frac{V_{OUT}}{R_{FA} \times C_{FA}} \times \frac{C_{RA}}{C_{FSA} + C_{RA}}$$

$$T = \frac{V_{HYS}}{dV_{rise}} + \frac{V_{HYS}}{dV_{fall}}$$

Expression 1

As the output voltage VOUT approaches the power supply voltage VDD, the rising slope dVrise of the first feedback voltage FVS1 is decreased, the period T of the control signal CS is increased and the duty cycle of the control signal CS is increased. When the output voltage VOUT exceeds the threshold voltage (e.g., 90% of the power supply voltage VDD) in the feedback controller 120 of FIG. 5, the second driver 140 operates more dominantly than the first driver 150. The second driver 140 may drive the output node NOUT that provides the output voltage VOUT with the third voltage VS3 proportional to the reference voltage VREF to prevent an increase of the period T and the duty cycle of the control signal CS.

Referring to FIG. 7, ripple injection circuit 121B includes a feedback resistor RFB and first and second capacitors CFB and CRB.

The feedback resistor is connected between the first voltage VS1 and a first internal node N41B. The first capacitor CFB is connected between the first internal node N41B and the output voltage VOUT. The second capacitor CRB is connected between the first internal node N41B and the sixth node N36. The voltage at the sixth node N36 may correspond to the ripple voltage RS as illustrated in FIG. 5.

If the voltage regulator 100 shown in FIG. 1 includes the feedback controller 120 of FIG. 5 implemented with the ripple injection circuit 121B of FIG. 7, the rising slope dVrise of the first feedback voltage FVS1 from the time point T1 to the time point T2 in FIG. 3 for example, the falling slope dVfall of the first feedback voltage FVS1 from the time point T2 to the time point T3 in FIG. 3 for example, and the period T of the control signal CS such as from the time period T1 to the time period T3 for example may be represented as Expression2, where VHYS is the hysteretic voltage of the hysteretic comparator 130.

$$dV_{rise} = \frac{V_{DD} - V_{OUT}}{R_{FB} \times C_{FB}}$$

$$dV_{fall} = \frac{V_{OUT}}{R_{FB} \times C_{FB}}$$

$$T = \frac{V_{HYS}}{dV_{rise}} + \frac{V_{HYS}}{dV_{fall}}$$

Expression 2

As the output voltage VOUT approaches the power supply voltage VDD, the rising slope dVrise of the first feedback voltage FVS1 is decreased, the period T of the control signal CS is increased and the duty cycle of the control signal CS is increased. When the output voltage VOUT exceeds the threshold voltage (e.g., 90% of the power supply voltage VDD) in the feedback controller 120 of FIG. 5, the second driver 140 operates more dominantly than the first driver 150. The second driver 140 may drive the output node NOUT that provides the output voltage VOUT with the third voltage VS3 proportional to the reference voltage VREF to prevent an increase of the period T and the duty cycle of the control signal CS.

Figure 8:
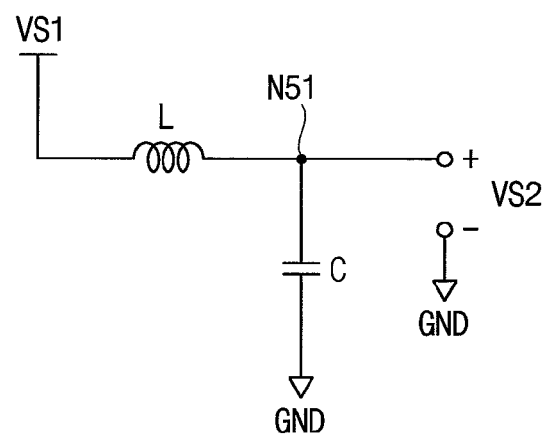
FIG. 8 illustrates a circuit diagram of a low pass filter included in the voltage regulator of FIG. 1 according to an example embodiment of the inventive concept.

FIG. 8 illustrates a circuit diagram of low pass filter 160 included in the voltage regulator of FIG. 1 according to example embodiments of the inventive concept.

Referring to FIG. 8, low pass filter 160 includes an inductor L and a capacitor C.

The inductor L is connected between the first voltage VS1 and a first internal node N51 that provides the second voltage VS2. The capacitor C is connected between the first internal node N51 and the ground voltage GND. The low pass filter may be implemented with various configurations other than the configuration of FIG. 8.

Figure 9:
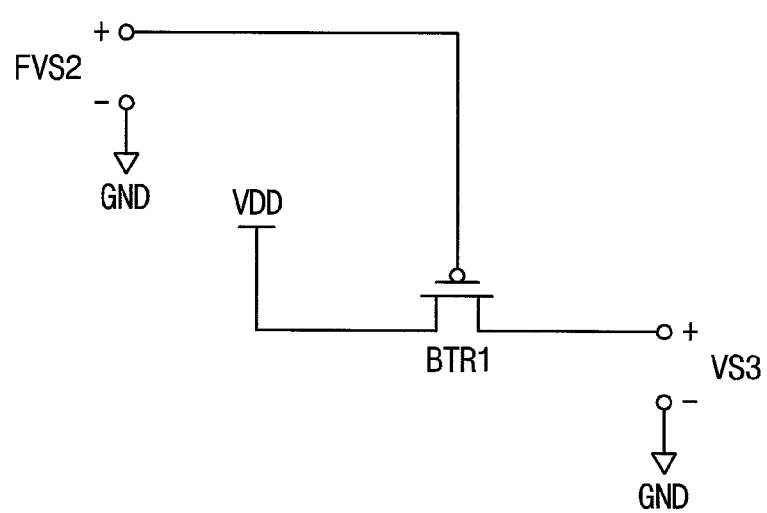
FIG. 9 illustrates a circuit diagram of a second driver included in the voltage regulator of FIG. 1 according to an example embodiment of the inventive concept.

FIG. 9 illustrates a circuit diagram of second driver 140 included in the voltage regulator of FIG. 1 according to an example embodiment of the inventive concept.

Referring to FIG. 9, second driver 140 includes a driving transistor BTR1.

The driving transistor BTR1 has a source electrode connected to the power supply voltage VDD, a gate electrode connected to the second feedback voltage FVS2 and a drain electrode providing the third voltage VS3. The second driver 140 may be referred to as a bypass driver and may be implemented with various configurations other than the configuration of FIG. 9.

Figure 10:
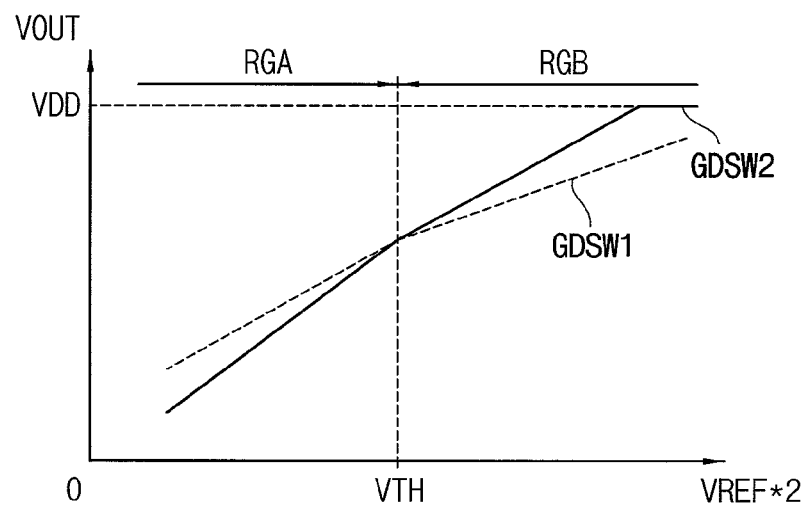
FIGS. 10, 11 and 12 illustrate diagrams for describing an operation of the voltage regulator of FIG. 1.
Figure 11:
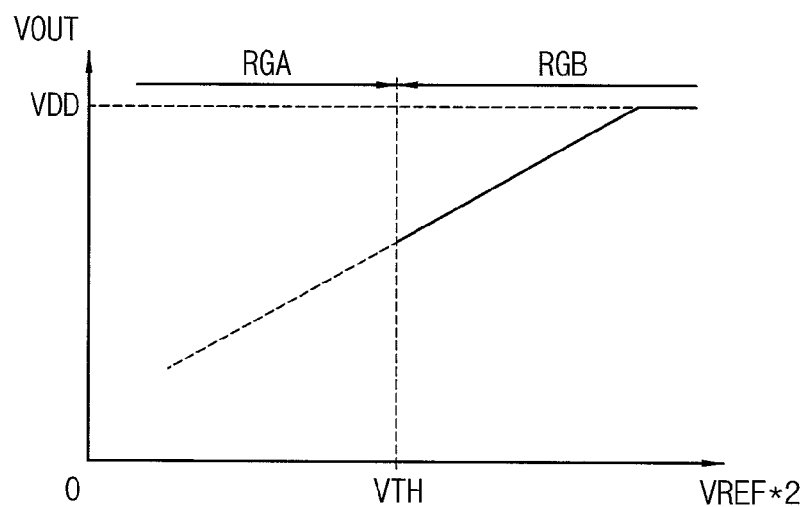
Figure 12:
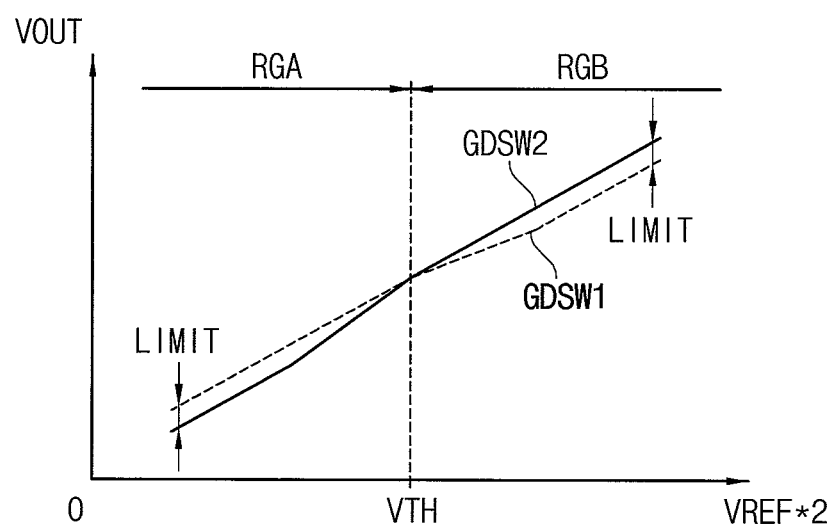

FIGS. 10, 11 and 12 illustrate diagrams for describing an operation of the voltage regulator of FIG. 1.

Referring to FIGS. 1 and 10, a first curve GDSW1 (indicated by the dashed line in FIG. 10) represents a case when only the first driver 150 operates among the first driver 150 and the second driver 140. The threshold voltage VTH may correspond to 90% of the power supply voltage VDD. In a first region RGA where the doubled reference voltage VREF*2 is lower than the threshold voltage VTH, the slope of the first curve GDSW1 is 1. In a second region RGB where the doubled reference voltage VREF*2 is higher than the threshold voltage VTH, the output current of the first amplifier AMP31 in FIG. 5 is applied to the sixth node N36 to increase the first feedback voltage FVS1, the output voltage VOUT is decreased through the feedback configuration of the voltage regulator 100 and thus the slope of the first curve GDSW1 becomes lower than 1.

A second curve GDSW2 (indicated by the solid line in FIG. 10) represents a case when only the second driver 140 operates among the first driver 150 and the second driver 140. The threshold voltage VTH may correspond to 90% of the power supply voltage VDD. In the first region RGA, the output current of the first amplifier AMP31 in FIG. 5 is applied to the seventh node N37 to increase the second feedback voltage FVS2, the output voltage VOUT is decreased through the feedback configuration of the voltage regulator 100 and thus the slope of the second curve GDSW2 becomes higher than 1. The slope of the second curve GDSW2 in the second region RGB is 1.

FIG. 11 illustrates a case when the first driver 150 and the second driver 140 in the voltage regulator 100 operate selectively. In the voltage regulator 100 of FIG. 1, the first driver 150 drives the output node NOUT dominantly in the first region RGA and the second driver 140 drives the output node NOUT dominantly in the second region RGB.

As illustrated in FIG. 11, the slope of the output voltage VOUT with respect to the reference voltage VREF in the first region RGA when the first feedback voltage FVS1 is activated is equal to the slope of the output voltage VOUT with respect to the reference voltage VREF in the second region RGB when the second feedback voltage FVS2 is activated.

FIG. 12 illustrates an example embodiment that the output current of the first amplifier AMP31 in FIG. 5 is controlled such that the difference between the second voltage VS2 and the third voltage VS3 is maintained smaller than a limit voltage LIMIT. Although the first driver 150 operates dominantly in the first region RGA, the second driver 140 may also operate in the first region RGA when the output voltage VOUT is decreased under the second curve GDSW2 due to transient undershoot. Although the second driver 140 operates dominantly in the second region RGB, the first driver 150 may also operate in the second region RGB when the output voltage VOUT is decreased under the first curve GDSW1 due to transient undershoot.

Figure 13:
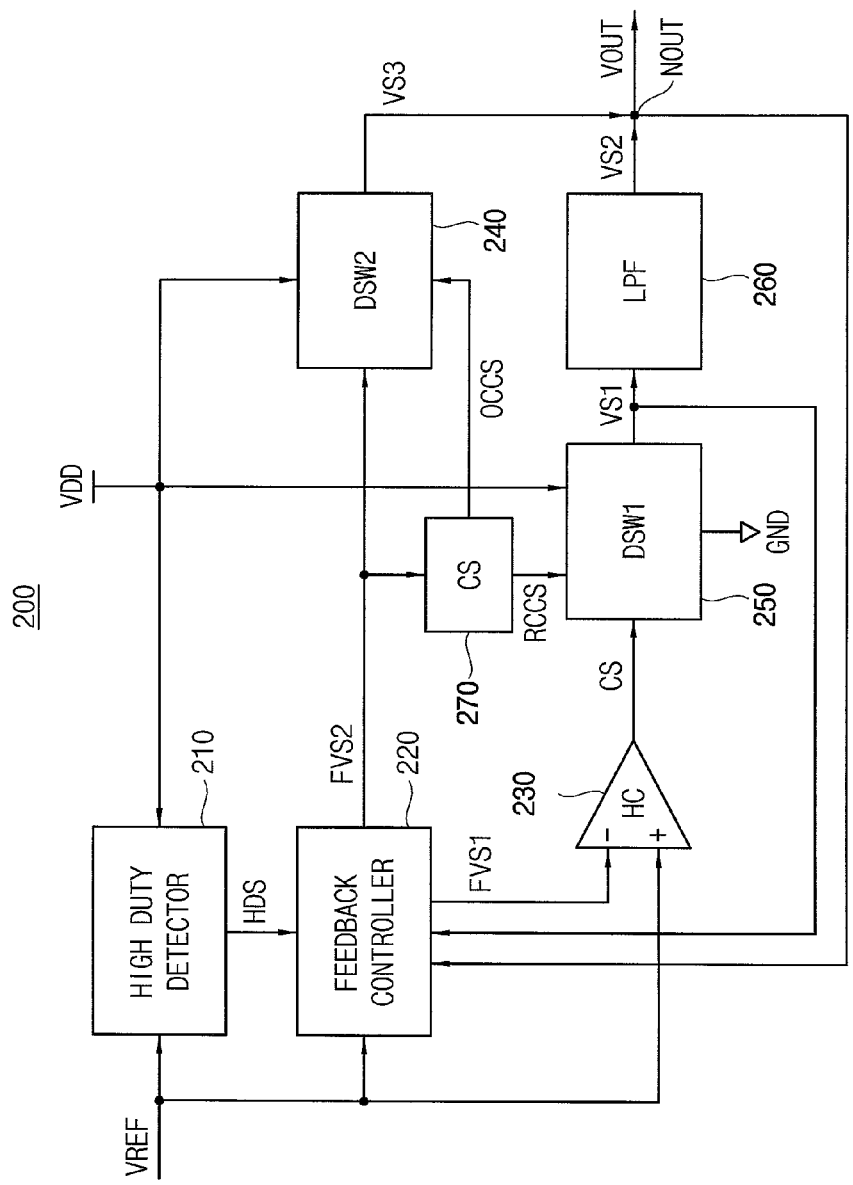
FIG. 13 illustrates a block diagram of a voltage regulator according to another example embodiment of the inventive concept.

FIG. 13 illustrates a block diagram of voltage regulator 200 according to another example embodiment of the inventive concept.

Referring to FIG. 13, voltage regulator 200 includes a high duty cycle detector 210, a feedback controller 220, a hysteretic comparator HC 230, a first driver DSW1 250, a low pass filter LPF 260, a second driver DSW2 240 and a current sensor CS 270. The following description of voltage regulator 200 shown in FIG. 13 will focus on components and functionality that are different than components and functionality of voltage regulator 100 shown in FIG. 1, and description of components and functionality of voltage generator 200 shown in FIG. 13 that are similar to voltage regulator 100 in FIG. 1 may be omitted for the sake of brevity.

The high duty cycle detector 210 generates a high duty cycle signal HDS based on a power supply voltage VDD and a reference voltage VREF. The high duty cycle detector 210 may have a configuration that is the same or similar to the duty cycle detector 110 of FIG. 2.

The feedback controller 220 generates a first feedback voltage FVS1 and a second feedback voltage FVS2 based on the reference voltage VREF, the high duty cycle signal HDS, the output voltage VOUT and a first voltage VS1. The hysteretic comparator 230 compares the reference voltage VREF and the first feedback voltage FVS1 to generate the control signal CS. The feedback controller 220 may have a configuration the same or similar to the feedback controller 120 of FIG. 5. The hysteretic comparator 230 may have a configuration the same or similar to the hysteretic comparator 130 in FIG. 1.

The current sensor 270 generates a reverse current control signal RCCS and an over current control signal OCCS based on the second feedback voltage FVS2. The first driver 250 drives the node that provides the first voltage VS1 with the power supply voltage VDD or a ground voltage GND based on the control signal CS and the reverse current control signal RCCS, when the first feedback voltage FVS1 is activated. The low pass filter 260 filters the first voltage VS1 to generate a second voltage VS2, and drives an output node NOUT that provides the output voltage VOUT with the second voltage VS2. The second driver 240 generates a third voltage VS3 proportional to the reference voltage VREF based on the power supply voltage VDD, the second feedback voltage FVS2 and the over current control signal OCCS when the second feedback voltage FVS2 is activated, and drives the output node NOUT with the third voltage VS3.

In some example embodiments of the inventive concept, the first driver 250 may be disabled when the reverse current control signal RCCS is activated and the second driver 240 may be disabled when the over current control signal OCCS is activated.

Figure 14:
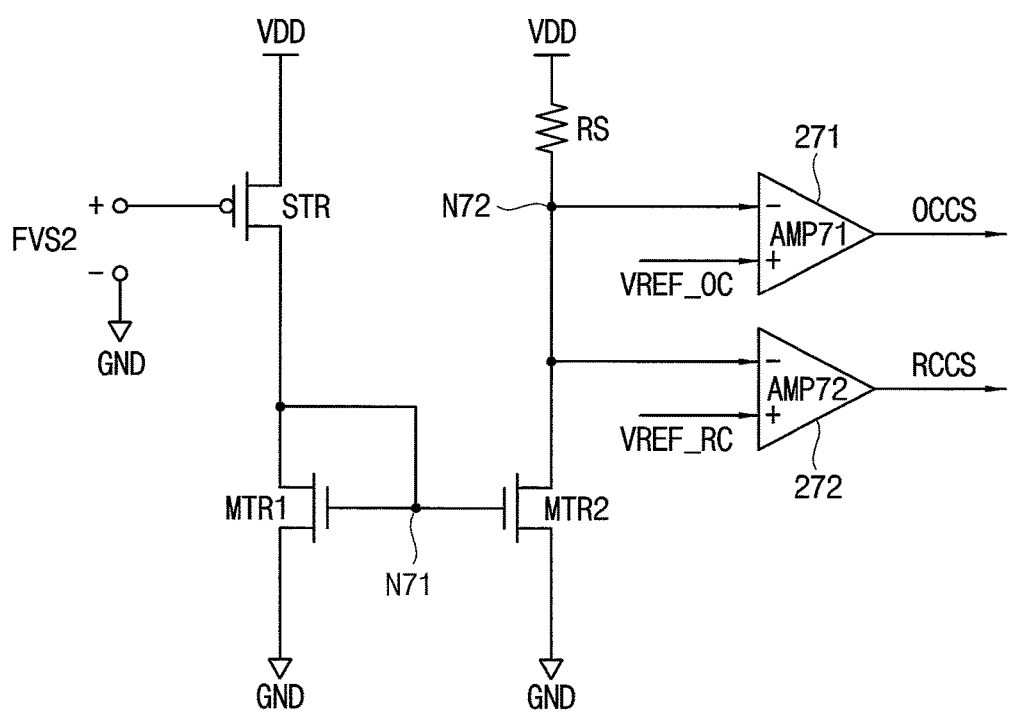
FIG. 14 illustrates a circuit diagram a current sensor included in the voltage regulator of FIG. 13 according to an example embodiment of the inventive concept.

FIG. 14 illustrates a circuit diagram of current sensor 270 included in the voltage regulator of FIG. 13 according to an example embodiment of the inventive concept.

Referring to FIG. 14, current sensor 270 includes a PMOS transistor STR, a first NMOS transistor MTR1, a second NMOS transistor MTR2, a sensing resistor RS, a first amplifier AMP71 271, and a second amplifier AMP72 272.

The PMOS transistor STR has a source electrode connected to the power supply voltage VDD, a drain electrode connected to a first node N61 and a gate electrode connected to the second feedback voltage FVS2. The first NMOS transistor MTR1 has source electrode connected to the ground voltage GND, a drain electrode connected to the first node N61 and a gate electrode connected to the first node N61. The second NMOS transistor MTR2 has a source electrode connected to the ground voltage GND, a drain electrode connected to a second node N62 and a gate electrode connected to the first node N61. The sensing resistor RS is connected between the power supply voltage VDD and the second node N62. The first amplifier 271 has a positive input terminal connected to an over current reference voltage VREF_OC, a negative input terminal connected to the second node N62 and an output terminal outputting the over current control signal OCCS. The second amplifier 272 has a positive input terminal connected to a reverse current reference voltage VREF_RC, a negative input terminal connected to the second node N62 and an output terminal outputting the reverse current control signal RCCS.

The PMOS transistor STR, the first NMOS transistor MTR1 and the second NMOS transistor MTR2 copy the current of the second driver 240, and apply the copied current through the sensing resistor RS. The first amplifier 271 deactivates the over current control signal OCCS when the copied current flowing through sensing resistor RS is small and the voltage at the second node N62 is higher than the over current reference voltage VREF_OC. The first amplifier 271 activates the over current control signal OCCS to disable the second driver 240 when the copied current flowing through sensing resistor RS is great and the voltage at the second node N62 is lower than the over current reference voltage VREF_OC. The second amplifier 272 deactivates the reverse current control signal RCCS when the copied current flowing through sensing resistor RS is small and the voltage at the second node N62 is higher than the reverse current reference voltage VREF_RC. The second amplifier 272 activates the reverse current control signal RCCS to disable a portion of the first driver 250 when the copied current flowing through sensing resistor RS is great and the voltage at the second node N72 is lower than the reverse current reference voltage VREF_RC.

Figure 15:
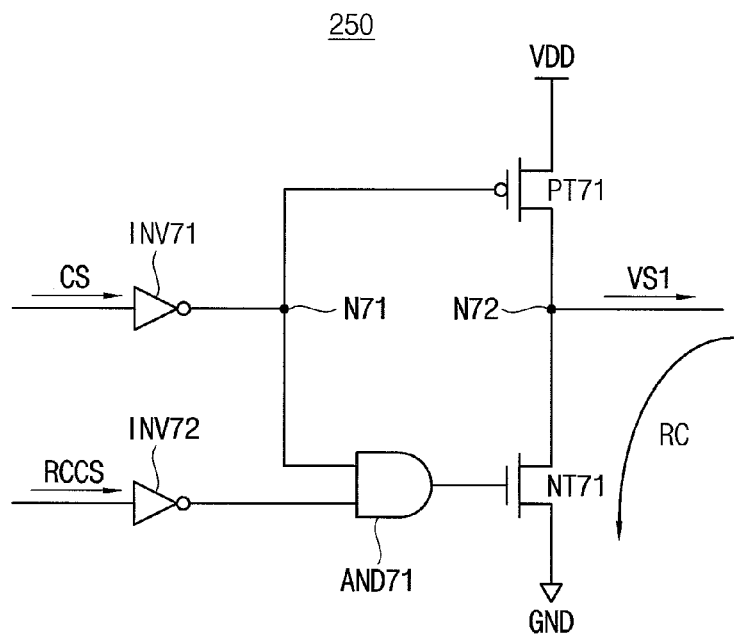
FIG. 15 illustrates a circuit diagram of a first driver included in the voltage regulator of FIG. 13 according to an example embodiment of the inventive concept.

FIG. 15 illustrates a circuit diagram of first driver 250 included in the voltage regulator of FIG. 13 according to an example embodiment of the inventive concept.

Referring to FIG. 15, first driver 250 includes a PMOS transistor PT71, an NMOS transistor NT71, a first inverter INV71, a second inverter INV72 and an AND logic gate AND71.

The first inverter INV71 has an input terminal connected to the control signal CS and an output terminal connected to a first node N71. The second inverter INV72 has an input terminal connected to the reverse current control signal RCCS. The AND logic gate AND71 has a first input terminal connected to an output terminal of the second inverter INV72 and a second input terminal connected to the first node N71. The PMOS transistor PT71 has a source electrode connected to the power supply voltage VDD, a drain electrode connected to a second node N72 and a gate electrode connected to first node N71. The second node N72 corresponds to the node that provides the first voltage VS1. The NMOS transistor NT71 has a source electrode connected to the ground voltage GND, a drain electrode connected to the second node N72 and a gate electrode connected to an output terminal of the AND logic gate AND71.

The PMOS transistor PT71 drives the second node N72 that provides the first voltage VS1 with the power supply voltage VDD when the control signal CS is activated. The NMOS transistor NT71 drives the second node N72 with the ground voltage GND when the control signal CS is deactivated and the reverse current control signal RCCS is deactivated. When the control signal CS is deactivated and the reverse current control signal RCCS is activated, the PMOS transistor PT71 and the NMOS transistor NT71 are turned off and thus the first driver 250 may by disabled. In this case, the reverse current RC through the NMOS transistor NT71 may be prevented.

Figure 16:
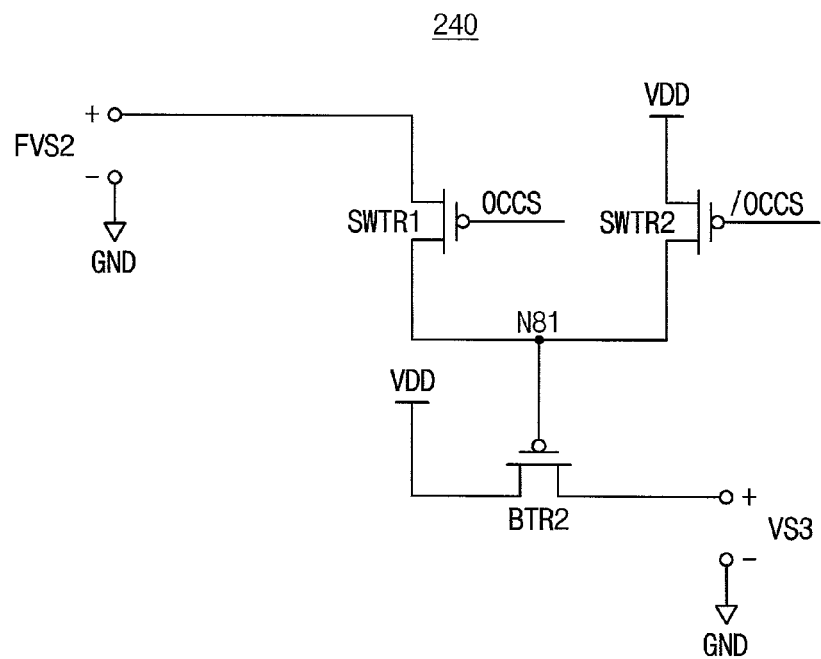
FIG. 16 illustrates a circuit diagram of a second driver included in the voltage regulator of FIG. 13 according to an example embodiment of the inventive concept.

FIG. 16 illustrates a circuit diagram of second driver 240 included in the voltage regulator of FIG. 13 according to an example embodiment of the inventive concept.

Referring to FIG. 16, second driver 240 includes a driving transistor BTR2, a first switching transistor SWTR1 and a second switching transistor SWTR2.

The driving transistor BTR2 has a source electrode connected to the power supply voltage VDD, a gate electrode connected to a node N81 and a drain electrode providing the third voltage VS3. The first switching transistor SWTR1 has a source electrode connected to the second feedback voltage FVS2, a gate electrode connected to the over current control signal OCCS and a drain electrode connected to the gate electrode of the driving transistor BTR2 through the node N81. The second switching transistor SWTR2 has a source electrode connected to the power supply voltage VDD, a gate electrode connected to an inversion signal /OCCS of the over current control signal OCCS and a drain electrode connected to the gate electrode of the driving transistor BTR2 through the node N81. The second driver 240 may be referred to as a bypass driver and may be implemented with various configurations other than the configuration of FIG. 16.

Figure 17:
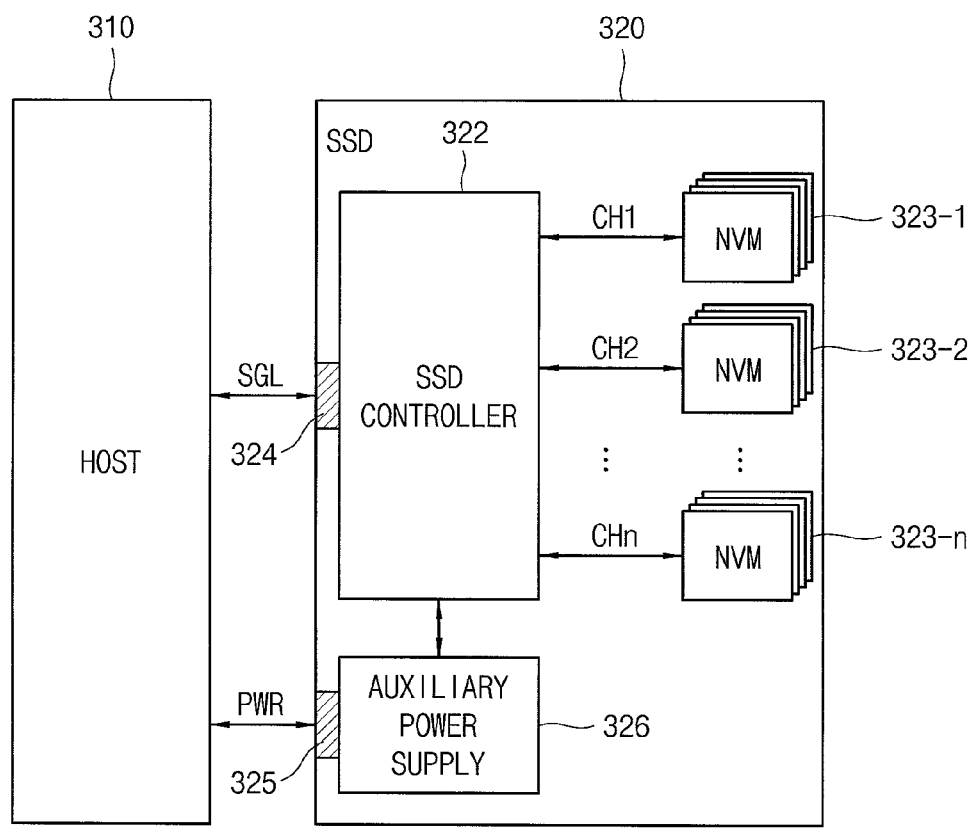
FIG. 17 illustrates a block diagram of a solid state drive (SSD) system according to an example embodiment of the inventive concept.

FIG. 17 illustrates a block diagram of a solid state drive (SSD) system according to an example embodiment of the inventive concept.

Referring to FIG. 17, SSD system 300 includes a host 310 and an SSD 320. The SSD 320 includes first through n-th non-volatile memory devices 323-1, 323-2, . . . , 323-n and an SSD controller 322. Here, n represents an integer greater than or equal to 2. The first through n-th non-volatile memory devices 323-1, 323-2, . . . , 323-n may be used as a storage medium of the SSD 320.

Each of the first through n-th non-volatile memory devices 323-1, 323-2, . . . , 323-n may include a memory cell array formed on a substrate with a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 322 is coupled to the first through n-th non-volatile memory devices 323-1, 323-2, ..., 323-n through first to n-th channels CH1, CH2, ..., CHn, respectively.

The SSD controller 322 exchanges a signal SGL with the host 310 through a signal connector 324. The signal SGL may include a command, an address and data. The SSD controller 322 may perform a program operation and a read operation on the first through n-th non-volatile memory devices 323-1, 323-2, ..., 323-n according to the command received from the host 310.

The SSD 320 may further include an auxiliary power supply 326. The auxiliary power supply 326 may receive power PWR from the host 310 through a power connector 325 and provide power to the SSD controller 322. The auxiliary power supply 326 may be placed inside or outside the SSD 320. For example, the auxiliary power supply 326 may be placed in a main board and provide auxiliary power to the SSD 320. According to example embodiments, the auxiliary power supply 326 may include one of the voltage regulators 100 and 200 of FIGS. 1 and 13.

Figure 18:
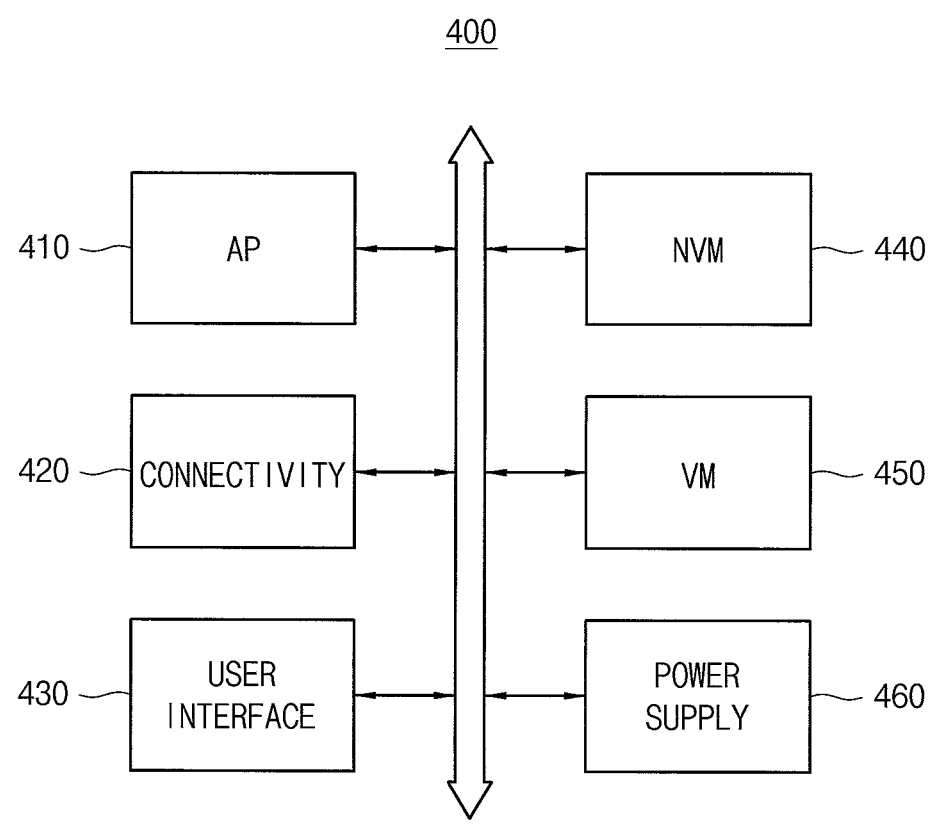
FIG. 18 illustrates a block diagram of a mobile system according to an example embodiment of the inventive concept.

FIG. 18 illustrates a block diagram of a mobile system according to an example embodiment of the inventive concept.

Referring to FIG. 18, mobile system 400 includes an application processor AP 410, a connectivity unit 420, a user interface 430, a non-volatile memory device NVM 440, a volatile memory device VM 450 and a power supply 460.

In some embodiments, the mobile system 400 may be a mobile phone, a smart phone, a personal digital assistant (PDA), a portable multimedia player (PMP), a digital camera, a music player, a portable game console, a navigation system, or the like.

The application processor 410 may execute applications, such as for example a web browser, a game application, and a video player, among various other applications. In some example embodiments, the application processor 410 may include a single core or multiple cores. For example, the application processor 410 may be a multi-core processor, such as a dual-core processor, a quad-core processor, a hexa-core processor, or a multi-core processor with any number of processors. The application processor 410 may include an internal or external cache memory.

The connectivity unit 420 may perform wired or wireless communication with an external device. For example, the connectivity unit 420 may perform Ethernet communication, near field communication (NFC), radio frequency identification (RFID) communication, mobile telecommunication, memory card communication, universal serial bus (USB) communication, or the like. In some embodiments, the connectivity unit 420 may include a baseband chipset that supports communications, such as for example global system for mobile communications (GSM), general packet radio service (GPRS), wideband code division multiple access (WCDMA), high speed downlink/uplink packet access (HSxPA), or the like.

The non-volatile memory device 440 may store a boot image for booting the mobile system 400.

The non-volatile memory device 440 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 450 may store data processed by the application processor 410, or may operate as a working memory.

The user interface 430 may include at least one input device, such as a keypad, a touch screen, or any other type of input device, and at least one output device, such as a speaker, a display device, or any other type of output device. The power supply 460 may supply an operating voltage to the mobile system 400. According to example embodiments, the power supply 460 may include one of the voltage regulators 100 and 200 of FIGS. 1 and 13 configured to output the operating voltage.

In some embodiments, the mobile system 400 may further include an image processor, and/or a storage device, such as a memory card, a solid state drive (SSD), a hard disk drive (HDD), a CD-ROM, or the like.

In some embodiments, the mobile system 400 and/or components of the mobile system 400 may be packaged in various forms, such as for example package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

The present inventive concept may be applied to various electronic devices including a voltage regulator. For example, the present inventive concept may be applied to systems such as for example mobile phones, smart phones, personal digital assistants (PDAs), portable multimedia players (PMPs), digital cameras, camcorders, personal computers (PCs), server computers, workstations, laptop computers, digital TVs, set-top boxes, portable game consoles, and navigation systems, among other various systems.

The foregoing is illustrative of example embodiments of the inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage regulator comprising:
a high duty cycle detector configured to generate a high duty cycle signal based on a power supply voltage and a reference voltage;
a feedback controller configured to generate a first feedback voltage and a second feedback voltage based on the reference voltage, the high duty cycle signal, an output voltage of the voltage regulator and a first voltage;
a hysteretic comparator configured to compare the reference voltage and the first feedback voltage to generate a control signal;

a first driver configured to drive a node that provides the first voltage with the power supply voltage or a ground voltage based on the control signal and the high duty cycle signal, when the first feedback voltage is activated;

a low pass filter configured to filter the first voltage to generate a second voltage and configured to drive an output node that provides the output voltage with the second voltage; and a second driver configured to generate a third voltage proportional to the reference voltage based on the power supply voltage and the second feedback voltage and configured to drive the output node with the third voltage, when the second feedback voltage is activated.

2. The voltage regulator of claim 1, wherein a logic level of the high duty cycle signal provides indication of whether a duty cycle of the control signal is higher than a reference value, and a slope of the output voltage with respect to the reference voltage when the first feedback voltage is activated is equal to a slope of the output voltage with respect to the reference voltage when the second feedback voltage is activated.

3. The voltage regulator of claim 1, wherein the first feedback voltage is activated when the first feedback voltage is equal to or lower than a sum of the reference voltage and a hysteretic voltage of the hysteretic comparator, and the first feedback voltage is deactivated when the first feedback voltage is higher than the sum of the reference voltage and the hysteretic voltage, and wherein the second feedback voltage is activated when the second feedback voltage is lower than the power supply voltage, and the second feedback voltage is deactivated when the second feedback voltage is equal to the power supply voltage.

4. The voltage regulator of claim 1, wherein the feedback controller is configured to activate the second feedback voltage and the second driver is configured to drive the output node with the third voltage, when the high duty cycle signal is activated, and wherein the feedback controller is configured to activate the first feedback voltage and the low pass filter is configured to drive the output node with the second voltage, when the high duty cycle signal is deactivated.

5. The voltage regulator of claim 1, wherein the high duty cycle detector comprises:

a first resistor connected between the power supply voltage and a first node;

a second resistor connected between the first node and the ground voltage; and a comparator having a positive input terminal connected to the reference voltage, a negative input terminal connected to the first node, and an output terminal, the comparator configured to provide the high duty cycle signal at the output terminal.

6. The voltage regulator of claim 1, wherein the hysteretic comparator has a positive input terminal connected to the reference voltage, a negative input voltage connected to the first feedback voltage and an output terminal, the hysteretic comparator configured to provide the control signal at the output terminal, and wherein the hysteretic comparator is further configured to activate the control signal when a voltage difference between the reference voltage and the first feedback voltage transitions from a negative value to a positive value, and deactivate the control signal when the voltage difference becomes lower than a hysteretic voltage of the hysteretic comparator.

7. The voltage regulator of claim 1, wherein the first driver is configured to drive the node that provides the first voltage with the power supply voltage when the control signal is activated, and drive the node that provides the first voltage with the ground voltage when the control signal is deactivated and the high duty cycle signal is deactivated, and the first driver is configured to be disabled when the control signal is deactivated and the high duty cycle signal is activated.

8. The voltage regulator of claim 1, wherein the first driver comprises:

a first inverter having an input terminal connected to the control signal and an output terminal connected to a first node;

a second inverter having an input terminal connected to the high duty cycle signal;

an AND logic gate having a first input terminal connected to an output terminal of the second inverter and a second input terminal connected to the first node;

a P-channel metal oxide semiconductor (PMOS) transistor having a source electrode connected to the power supply voltage, a drain electrode connected to a second node and a gate electrode connected to the first node, wherein the second node is the node that provides the first voltage; and an N-channel metal oxide semiconductor (NMOS) transistor having a source electrode connected to the ground voltage, a drain electrode connected to the second node and a gate electrode connected to an output terminal of the AND logic gate.

9. The voltage regulator of claim 1, wherein the feedback controller comprises:

a first resistor connected between the power supply voltage and a first node;

a second resistor connected between the first node and the ground voltage;

a first switch configured to selectively connect the first node and a third node in response to the high duty cycle signal;

a second switch configured to selectively connect a second node and the third node in response to the high duty cycle signal, wherein the second node is connected to the reference voltage;

a third switch configured to selectively connect the second node and a fourth node in response to the high duty cycle signal;

a fourth switch configured to selectively connect the first node and the fourth node in response to the high duty cycle signal;

a first amplifier having a positive input terminal connected to the third node, a negative input terminal connected to the fourth node, and an output terminal connected to a fifth node;

a fifth switch configured to selectively connect the fifth node and a sixth node in response to the high duty cycle signal to provide the first feedback voltage from the sixth node when the fifth and sixth nodes are connected;

a sixth switch configured to selectively connect the fifth node and a seventh node in response to the high duty cycle signal;

a third resistor connected between the output voltage and the sixth node;

a fourth resistor connected between the sixth node and the ground voltage;

a ripple injection circuit configured to generate a ripple voltage and to apply the ripple voltage to the sixth node;
a fifth resistor connected between the output voltage and the seventh node;
a sixth resistor connected between the seventh node and the ground voltage; and
a second amplifier having a positive input terminal connected to the seventh node, a negative input terminal connected to the reference voltage, and an output terminal, the second amplifier configured to provide the second feedback voltage at the output terminal of the second amplifier.

10. The voltage regulator of claim 1, wherein the low pass filter comprises:
an inductor connected between the first voltage and a first internal node; and
a capacitor connected between the first internal node and the ground voltage,
wherein the low pass filter is configured to provide the second voltage at the first internal node, and
wherein the second driver comprises a driving transistor having a source electrode connected to the power supply voltage, a gate electrode connected to the second feedback voltage and a drain electrode, the driving transistor configured to provide the third voltage at the drain electrode.

11. A voltage regulator comprising:
a high duty cycle detector configured to generate a high duty cycle signal based on a power supply voltage and a reference voltage;
a feedback controller configured to generate a first feedback voltage and a second feedback voltage based on the reference voltage, the high duty cycle signal, an output voltage of the voltage regulator and a first voltage;
a hysteretic comparator configured to compare the reference voltage and the first feedback voltage to generate a control signal;
a current sensor configured to generate a reverse current control signal and an over current control signal based on the second feedback voltage;
a first driver configured to drive a node that provides the first voltage with the power supply voltage or a ground voltage based on the control signal and the reverse current control signal, when the first feedback voltage is activated;
a low pass filter configured to filter the first voltage to generate a second voltage and configured to drive an output node that provides the output voltage with the second voltage; and
a second driver configured to generate a third voltage proportional to the reference voltage based on the power supply voltage, the second feedback voltage and the over current control signal and configured to drive the output node with the third voltage, when the second feedback voltage is activated.

12. The voltage regulator of claim 11, wherein the first driver is configured to be disabled when the reverse current control signal is activated, and the second driver is configured to be disabled when the over current control signal is activated.

13. The voltage regulator of claim 11, wherein the current sensor comprises:
a P-channel metal oxide semiconductor (PMOS) transistor having a source electrode connected to the power supply voltage, a drain electrode connected to a first node and a gate electrode connected to the second feedback voltage;
a first N-channel metal oxide semiconductor (NMOS) transistor having a source electrode connected to the ground voltage, a drain electrode connected to the first node and a gate electrode connected to the first node;
a second NMOS transistor having a source electrode connected to the ground voltage, a drain electrode connected to a second node and a gate electrode connected to the first node;
a sensing resistor connected between the power supply voltage and the second node;
a first amplifier having a positive input terminal connected to an over current reference voltage, a negative input voltage connected to the second node, and an output terminal, the first amplifier configured to provide the over current control signal at the output terminal of the first amplifier; and
a second amplifier having a positive input terminal connected to a reverse current reference voltage, a negative input voltage connected to the second node and an output terminal, the second amplifier configured to provide the reverse current control signal at the output terminal of the second amplifier.

14. The voltage regulator of claim 11, wherein the first driver comprises:
a first inverter having an input terminal connected to the control signal and an output terminal connected to a first node;
a second inverter having an input terminal connected to the reverse current control signal;
an AND logic gate having a first input terminal connected to an output terminal of the second inverter and a second input terminal connected to the first node;
a PMOS transistor having a source electrode connected to the power supply voltage, a drain electrode connected to a second node and a gate electrode connected to the first node, wherein the second node is the node that provides the first voltage; and
an NMOS transistor having a source electrode connected to the ground voltage, a drain electrode connected to the second node and a gate electrode connected to an output terminal of the AND logic gate.

15. The voltage regulator of claim 11, wherein the second driver comprises:
a driving transistor having a source electrode connected to the power supply voltage, a gate electrode, and a drain electrode, the driving transistor configured to provide the third voltage at the drain electrode of the driving transistor;
a first switching transistor having a source electrode connected to the second feedback voltage, a gate electrode connected to the over current control signal and a drain electrode connected to the gate electrode of the driving transistor; and
a second switching transistor having a source electrode connected to the power supply voltage, a gate electrode connected to an inverted version of the over current control signal and a drain electrode connected to the gate electrode of the driving transistor.

16. A mobile system comprising:
at least one processor configured to execute applications stored in a memory device;
a connectivity unit configured to perform wireless communications with an external device; and a power supply unit configured to supply an operating voltage to the mobile system, the power supply unit comprising a voltage regulator configured to output the operating voltage, the voltage regulator comprising a high duty cycle detector configured to generate a high duty cycle signal based on a power supply voltage and a reference voltage;

a feedback controller configured to generate a first feedback voltage and a second feedback voltage based on the reference voltage, the high duty cycle signal, the operating voltage and a first voltage;

a hysteretic comparator configured to compare the reference voltage and the first feedback voltage to generate a control signal;

a first driver configured to drive a node that provides the first voltage with the power supply voltage or a ground voltage based on the control signal, when the first feedback voltage is activated;

a low pass filter configured to filter the first voltage to generate a second voltage and configured to drive an output node that provides the operating voltage with the second voltage; and a second driver configured to generate a third voltage proportional to the reference voltage based on the power supply voltage and the second feedback voltage and configured to drive the output node with the third voltage, when the second feedback voltage is activated.

17. The mobile system of claim 16, wherein the first driver is configured to drive the node that provides the first voltage further based on the high duty cycle signal.

18. The mobile system of claim 16, wherein the voltage regulator further comprises a current sensor configured to generate a reverse current control signal and an over current control signal based on the second feedback voltage, and wherein the first driver is configured to drive the node that provides the first voltage further based on the reverse current control signal.

19. The mobile system of claim 18, wherein the second driver is configured to generate the third voltage further based on the over current control signal.

20. The mobile system of claim 19, wherein the first driver is configured to be disabled when the reverse current control signal is activated, and the second driver is configured to be disabled when the over current control signal is activated.

\* \* \* \* \*